(12) United States Patent
Jin et al.

(10) Patent No.: US 12,433,098 B2
(45) Date of Patent: Sep. 30, 2025

(54) DISPLAY PANEL AND DISPLAY DEVICE WITH REDUCED THICKNESS OF LIGHT-EMITTING LAYER IN DISPLAY LIGHT-TRANSMITTING REGION

(71) Applicant: Wuhan China Star Optoelectronics Semiconductor Display Technology Co., Ltd., Hubei (CN)

(72) Inventors: Meng Jin, Hubei (CN); Lei Lv, Hubei (CN); Lin Yang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/637,459

(22) PCT Filed: Jan. 28, 2022

(86) PCT No.: PCT/CN2022/074746
§ 371 (c)(1),
(2) Date: Feb. 23, 2022

(87) PCT Pub. No.: WO2023/137796
PCT Pub. Date: Jul. 27, 2023

(65) Prior Publication Data
US 2024/0057379 A1 Feb. 15, 2024

(30) Foreign Application Priority Data
Jan. 24, 2022 (CN) .......................... 202210080308.6

(51) Int. Cl.
*H10K 59/121* (2023.01)
*H10K 59/65* (2023.01)
*H10K 102/00* (2023.01)

(52) U.S. Cl.
CPC ........... *H10K 59/121* (2023.02); *H10K 59/65* (2023.02); *H10K 2102/351* (2023.02)

(58) Field of Classification Search
CPC .......................... H10K 59/121; H10K 59/65
See application file for complete search history.

(56) References Cited

U.S. PATENT DOCUMENTS

2018/0083221 A1    3/2018   Kim et al.

FOREIGN PATENT DOCUMENTS

| CN | 108550713 | 9/2018 |
|----|-----------|--------|
| CN | 110783370 | 2/2020 |

(Continued)

OTHER PUBLICATIONS

International Search Report and the Written Opinion Dated Aug. 29, 2022 From the International Searching Authority Re. Application No. PCT/CN2022/074746 and its Translation Into English. (21 Pages).

(Continued)

*Primary Examiner* — Suberr L Chi

(57) ABSTRACT

A display panel and a display device are disclosed. The display panel includes a first electrode layer, a light-emitting layer, and a second electrode layer sequentially stacked. The light-emitting layer includes first pixels disposed in a display light-transmitting region and second pixels disposed in a main display region. A first opening between the first pixels adjacent to each other is defined by the second electrode layer. A thickness of the light-emitting layer corresponding to the first opening is less than a thickness of the light-emitting layer between the second pixels adjacent to each other. Not only can the light transmittance of the display light-transmitting region be increased, but the process can be simpler.

20 Claims, 5 Drawing Sheets

(56) References Cited

FOREIGN PATENT DOCUMENTS

| | | |
|---|---|---|
| CN | 111009619 | 4/2020 |
| CN | 111384284 | 7/2020 |
| CN | 112201761 | 1/2021 |
| CN | 112331703 | 2/2021 |
| CN | 112490266 | 3/2021 |
| WO | WO 2020/134007 | 7/2020 |

OTHER PUBLICATIONS

Notification of Office Action and Search Report Dated Nov. 28, 2022 From the State Intellectual Property Office of the People's Republic of China Re. Application No. 202210080308.6 and its Translation Into English. (14 Pages).

DISPLAY PANEL AND DISPLAY DEVICE WITH REDUCED THICKNESS OF LIGHT-EMITTING LAYER IN DISPLAY LIGHT-TRANSMITTING REGION

RELATED APPLICATIONS

This application is a National Phase of PCT Patent Application No. PCT/CN2022/074746 having International filing date of Jan. 28, 2022, which claims the benefit of priority of Chinese Patent Application No. 202210080308.6 filed on Jan. 24, 2022. The contents of the above applications are all incorporated by reference as if fully set forth herein in their entirety.

FIELD AND BACKGROUND OF THE INVENTION

The present disclosure relates to a field of display technologies, and more particularly to a display panel and a display device.

In the design of active-matrix organic light-emitting diode (AMOLED) display panels, how to implement full-screen display and under-display light-sensing of AMOLED panels is always a difficult problem, and the main difficulty is how to improve the light transmittance of the light-sensing region. Currently, the common design is to form holes in the light-sensing region of the panel. The transmittance of the panel will be higher in this way, but this region will not emit light and cannot demonstrate a full-screen display effect. Another way that has emerged in recent years is to reduce the pixel density of the light-sensing region of the panel to enhance the transmittance of the panel, while ensuring the normal light-emitting of the region. The display effect of the full screen can be implemented in this way, but the overall transmittance is still low and less than 18%. Therefore, how to improve the light transmittance of AMOLED panels is still a problem to be solved.

SUMMARY OF THE INVENTION

Technical Problem

Embodiments of the present application provide a display panel and a display device to solve the technical problem that the light-sensing region of the existing display panel has a lower light transmittance while implementing light-emitting display.

Technical Solutions

In order to solve the above problems, the present application provides technical solutions as follows.

Embodiments of the present application provide a display panel comprising a display light-transmitting region and a main display region disposed outside the display light-transmitting region, the display panel comprising:
  a substrate;
  a first electrode layer disposed on one side of the substrate;
  a light-emitting layer disposed on one side of the first electrode layer away from the substrate, the light-emitting layer comprising: a plurality of first pixels disposed in the display light-transmitting region and a plurality of second pixels disposed in the main display region; a number of the first pixels per unit area being equal to a number of the second pixels per unit area;
  a second electrode layer disposed on one side of the light-emitting layer away from the substrate, a first opening between the first pixels adjacent to each other in the display light-transmitting region being defined by the second electrode layer;
  wherein a thickness of the light-emitting layer corresponding to the first opening in the display light-transmitting region is less than a thickness of the light-emitting layer between the second pixels adjacent to each other in the main display region;
  the second electrode layer has a protruded structure disposed at an edge of the first opening.

In some embodiments of the present application, the thickness of the light-emitting layer corresponding to the first opening in the display light-transmitting region is less than a thickness of the light-emitting layer between the first pixels adjacent to each other and overlapping with the second electrode layer in the display light-transmitting region.

In some embodiments of the present application, the light-emitting layer comprises: a hole injection layer, a hole transport layer, an electron transport layer, and an electron injection layer sequentially stacked,
  a second opening corresponding to the first opening in the display light-transmitting region is defined by the light-emitting layer, the second opening at least passes through the electron injection layer.

In some embodiments of the present application, the first opening has a minimum distance greater than or equal to 2 µm from the first pixel adjacent thereto.

In some embodiments of the present application, the first electrode layer comprises: a first electrode block disposed corresponding to the first pixel;
  the first opening has a minimum distance greater than or equal to 2 µm from the first electrode block adjacent thereto.

In some embodiments of the present application, the display panel further comprises a first inorganic layer covering the second electrode layer, a maximum thickness of the protruded structure is less than a thickness of the first inorganic layer.

Embodiments of the present application provide another display panel comprising a display light-transmitting region and a main display region disposed outside the display light-transmitting region, the display panel comprising:
  a substrate;
  a first electrode layer disposed on one side of the substrate;
  a light-emitting layer disposed on one side of the first electrode layer away from the substrate, the light-emitting layer comprising: a plurality of first pixels disposed in the display light-transmitting region and a plurality of second pixels disposed in the main display region;
  a second electrode layer disposed on one side of the light-emitting layer away from the substrate, a first opening between the first pixels adjacent to each other in the display light-transmitting region being defined by the second electrode layer;
  wherein a thickness of the light-emitting layer corresponding to the first opening in the display light-transmitting region is less than a thickness of the light-emitting layer between the second pixels adjacent to each other in the main display region.

In some embodiments of the present application, the thickness of the light-emitting layer corresponding to the first opening in the display light-transmitting region is less than a thickness of the light-emitting layer between the first pixels adjacent to each other and overlapping with the second electrode layer in the display light-transmitting region.

In some embodiments of the present application, the light-emitting layer comprises: a hole injection layer, a hole transport layer, an electron transport layer, and an electron injection layer sequentially stacked, a second opening corresponding to the first opening in the display light-transmitting region is defined by the light-emitting layer, the second opening at least passes through the electron injection layer.

In some embodiments of the present application, the second electrode layer has a protruded structure disposed at an edge of the first opening.

In some embodiments of the present application, the first opening has a minimum distance greater than or equal to 2 μm from the first pixel adjacent thereto.

In some embodiments of the present application, the first electrode layer comprises: a first electrode block disposed corresponding to the first pixel;

the first opening has a minimum distance greater than or equal to 2 μm from the first electrode block adjacent thereto.

In some embodiments of the present application, the display panel further comprises a first inorganic layer covering the second electrode layer, a maximum thickness of the protruded structure is less than a thickness of the first inorganic layer.

In some embodiments of the present application, the maximum thickness of the protruded structure is less than 1 μm.

In some embodiments of the present application, a number of the first pixels per unit area is equal to a number of the second pixels per unit area.

In some embodiments of the present application, the display panel further comprises:

a driving circuit layer disposed between the substrate and the light-emitting layer, the driving circuit layer comprises a first pixel driving circuit driving the first pixels to emit light and a second pixel driving circuit driving the second pixels to emit light; the display light-transmitting region comprises a light-transmitting subregion and a transition subregion, the transition subregion is disposed between the light-transmitting subregion and the main display region;

the first pixel driving circuit driving the first pixels in the light-transmitting subregion to emit light is disposed in the transition subregion, or, the first pixel driving circuit driving the first pixels in the light-transmitting subregion to emit light is disposed in the light-transmitting subregion and overlapping with the first pixels corresponding thereto.

Embodiments of the present application also provide a display device comprising a display panel of any one of the embodiments mentioned above and an image sensor. The image sensor is disposed corresponding to the display light-transmitting region.

Beneficial Effects

The display panel and the display device disclosed by the embodiments of the present application include a display light-transmitting region and a main display region disposed outside the display light-transmitting region. The display panel includes a substrate, a first electrode layer disposed on one side of the substrate, a light-emitting layer disposed on one side of the first electrode layer away from the substrate, and a second electrode layer disposed on one side of the light-emitting layer away from the substrate. The light-emitting layer includes a plurality of first pixels disposed in the display light-transmitting region and a plurality of second pixels disposed in the main display region. A first opening between the first pixels adjacent to each other in the display light-transmitting region is defined by the second electrode layer. A thickness of the light-emitting layer corresponding to the first opening in the display light-transmitting region is less than a thickness of the light-emitting layer between the second pixels adjacent to each other in the main display region. By reducing the thickness of the light-emitting layer at the first opening of the second electrode layer in the display light-transmitting region, the embodiments of the present application not only improve the light transmittance of the display light-transmitting region while ensuring the normal display of the first pixels of the display light-transmitting region, but also make the process simpler.

DESCRIPTION OF SPECIFIC EMBODIMENTS OF THE INVENTION

Figure 1:
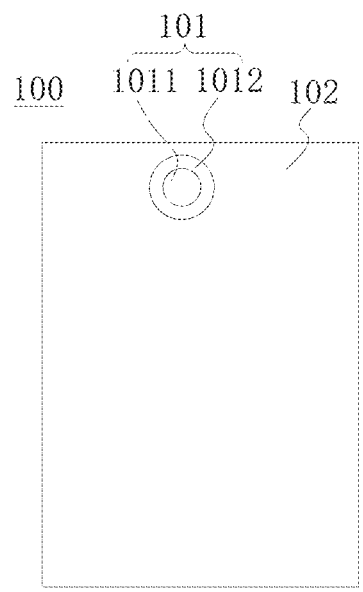
FIG. 1 is a schematic plan view of a display panel provided in an embodiment of the present application.

The technical solutions in the embodiments of the present application will be clearly and completely described below with the accompanying drawings in the embodiments of the present application. Obviously, the described embodiments are merely part of embodiments of the present application, but not all embodiments. Based on the embodiments of the present application, all other embodiments obtained by a person skilled in the art without creative labor, should be considered within the scope of protection of the present application.

In the description of the present application, it is to be understood that the terms "width", "thickness", "upper", "lower", "horizontal", "top", etc. are positional relationships based on the orientations or positional relationships shown in the drawings, and are merely for the convenience of the description of the present application and the simplified description, and do not indicate or imply that the device or component referred to have specific orientations, and are constructed and operated in specific orientations. Therefore, these should not be construed as limiting the present application. Moreover, the terms "first" and "second" are used for descriptive purposes only and are not to be construed as indicating or implying a relative importance or implicitly indicating the number of indicated technical features. Thus, features defining "first" and "second" may include one or more of the features with either explicitly or implicitly.

In the description of the present application, "plurality" means two or more unless with being specifically indicated otherwise. In the present application, unless otherwise expressly specified and limited, the first feature "on" or "under" the second feature may include a direct contact between the first and second features, or may include a contact between the first and second features which is not a direct contact but is a contact through an additional feature between them.

Please refer to FIG. 1. An embodiment of the present application provides a display panel 100 including a display light-transmitting region 101 and a main display region 102 disposed outside the display light-transmitting region 101. A light transmittance of the display light-transmitting region 101 is greater than a light transmittance of the main display region 102. An area of the main display region 102 is greater than an area of the display light-transmitting region 101. The main display region 102 is used for implementing regular display. The display light-transmitting region 101 is a region of high light transmittance. The display light-transmitting region 101 is used for implementing display and further used for built-in image sensor such as camera, optical fingerprint sensor, etc., simultaneously.

In an embodiment of the present application, the main display region 102 is disposed around the display light-transmitting region 101. A shape of the display light-transmitting region 101 includes but not limited to any one of a circle, an ellipse, and a rectangle.

Figure 2:
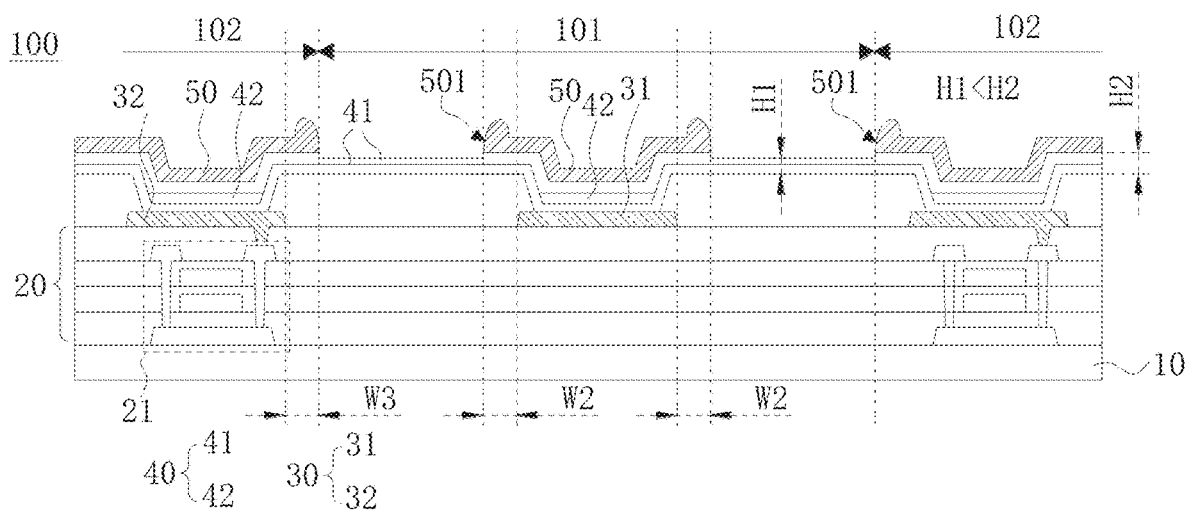
FIG. 2 is a schematic diagram of a stacked structure of film layers of a display panel provided in an embodiment of the present application.

Please refer to FIG. 2. The display panel 100 includes a substrate 10, a first electrode layer 30 disposed on one side of the substrate 10, a light-emitting layer 40 disposed on one side of the first electrode layer 30 away from the substrate 10, and a second electrode layer 50 disposed on one side of the light-emitting layer 40 away from the substrate 10. In an embodiment of the present application, the first electrode layer 30 can be a cathode layer, and the second electrode layer 50 can be an anode layer.

Figure 3:
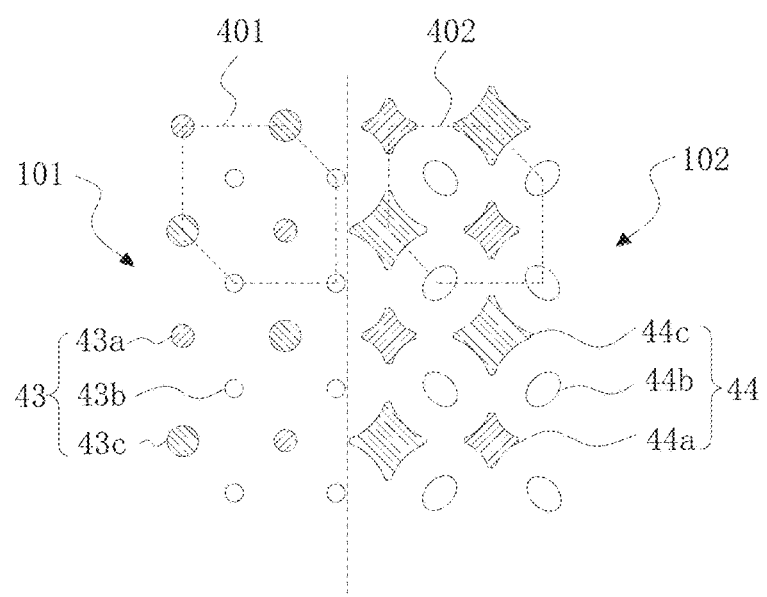
FIG. 3 is a schematic diagram of an arrangement of first pixels and second pixels provided in an embodiment of the present application.

As shown in FIG. 3, the light-emitting layer 40 includes a plurality of first pixels 43 disposed in the display light-transmitting region 101 and a plurality of second pixels 44 disposed in the main display region 102. A driving circuit layer 20 is disposed between the substrate 10 and the light-emitting layer 40. The driving circuit layer 20 includes a plurality of first pixel driving circuits and a plurality of second pixel driving circuits 21. The first pixel driving circuits are used for driving the first pixels 43 to emit light, the second pixel driving circuits 21 are used for driving the second pixels 44 to emit light. The first pixel driving circuits and the second pixel driving circuits 21 include a plurality of thin film transistors (TFT), the first pixel driving circuits and the second pixel driving circuits 21 include but not limited to any one of a 7T1C (7 thin film transistors and 1 capacitor) structure, a 3T1C structure, a 2T1C structure, and a 6T1C structure.

As shown in FIG. 1, in an embodiment of the present application, the display light-transmitting region 101 further includes a light-transmitting subregion 1011 and a transition subregion 1012. The transition subregion 1012 is disposed between the light-transmitting subregion 1011 and the main display region 102. In an embodiment of the present application, the first pixel driving circuit driving the first pixels 43 in the light-transmitting subregion 1011 to emit light can be disposed in the transition subregion 1012, namely shifting the thin film transistors driving the first pixels 43 in the light-transmitting subregion 1011 to be disposed outside the light-transmitting subregion 1011. The first pixel driving circuits driving the first pixels 43 of the light-transmitting subregion 1011 and the transition subregion 1012 are all disposed in the transition subregion 1012, so that the metal density of the light-transmitting subregion 1011 is reduced, and the transmittance of the light-transmitting subregion 1011 is enhanced. The first pixels 43 of the light-transmitting subregion 1011 can be electrically connected with the corresponding first pixel driving circuits by a transparent wire.

In another embodiment, the first pixel driving circuit driving the first pixels 43 in the light-transmitting subregion 1011 to emit light can be disposed in the light-transmitting subregion 1011 and overlapping with the first pixels 43 corresponding thereto. That is, the first pixel driving circuit driving the first pixels 43 of the light-transmitting subregion 1011 to emit light has an orthographic projection on the substrate 10 that overlaps with an orthographic projection of the corresponding first pixels 43 on the substrate 10. In other words, the first pixel driving circuit driving the first pixels 43 of the light-transmitting subregion 1011 to emit light is disposed right below the corresponding first pixels 43.

The light-emitting layer 40 includes a light-emitting material layer 42 and a common layer 41. The light-emitting material layer 42 is not disposed on the whole surface. The light-emitting material layer 42 is disposed corresponding to the first pixels 43 and the second pixels 44. The material of the light-emitting material layer 42 is not formed between the adjacent pixels. The common layer 41 can be a film layer, which is a continuous film layer, evaporated on the whole surface. The common layer 41 includes a hole injection layer, a hole transport layer, an electron transport layer, and an electron input layer sequentially stacked. The light-emitting material layer 42 is disposed between the hole transport layer and the electron transport layer.

As shown in FIG. 3, the first pixels 43 and the second pixels 44 both include an organic light-emitting diode (OLED). In an embodiment of the present application, the pixel density of the first pixels of the display light-transmitting region 101 is equal to the pixel density of the second pixels of the main display region 102, namely a number of the first pixels 43 of the display light-transmitting region 101 per unit display area is equal to a number of the second pixels 44 of the main display region 102 per unit area, thereby reducing the overall display difference between a display screen of the display light-transmitting region 101 and a display screen of the main display region 102.

The plurality of first pixels 43 include first red sub-pixels 43a, first green sub-pixels 43b, and first blue sub-pixels 43c. The plurality of second pixels 44 include second red sub-pixels 44a, second green sub-pixels 44b, and second blue sub-pixels 44c.

A plurality of first pixel repeating units 401 are disposed in the display light-transmitting region 101. The first pixel repeating units 401 include a certain number of the first pixels 43. A plurality of second pixel repeating units 402 are disposed in the main display region 102. The second pixel repeating units 402 include a certain number of the second pixels 44. The certain number of the first pixels 43 included in the first pixel repeating units 401 is equal to the certain number of the second pixels 44 included in the second pixel repeating units 402. Within the same display area, the display light-transmitting region 101 includes an equal number of the first pixel repeating units 401 as the main display region 102 includes the second pixel repeating units 402.

The first pixel repeating units 401 and the second pixel repeating units 402 are arranged in the same arrangement manner. The arrangement manner includes an arrangement pattern, an arrangement distance, etc., of each sub-pixel. A shape and an area of the first pixels 43 can be different from a shape and an area of the second pixels 44 having the same color. In an embodiment of the present application, a shape of the first red sub-pixel 43a, a shape of the first green sub-pixel 43b, and a shape of the first blue sub-pixel 43c can be all circular. An area of the first blue sub-pixel 43c, an area of the first red sub-pixel 43a, and an area of the first green sub-pixel 43b can be decreased in order. A shape of the second red sub-pixel 44a can be octagonal, a shape of the second green sub-pixel 44b can be oval, and a shape of the second blue sub-pixel 44c may be octagonal.

The area of the sub-pixels of the same color in the display light-transmitting region 101 is different from that in the main display region 102, and the areas of the red, green, and blue sub-pixels in the display light-transmitting region 101 are smaller than the areas of the corresponding red, green, and blue sub-pixels in the main display region 102, respectively. By reducing the area of the first sub-pixel 25 in the display light-transmitting region 101 and keeping the pixel density in the display light-transmitting region 101 unchanged, the light transmittance of the display light-transmitting region 101 can be increased.

The first pixel repeating unit 401 and the second pixel repeating unit 402 both utilize an arrangement manner of pentile. Taking the first pixel repeating unit 401 as an example, the first pixel repeating unit 401 is arranged in a 4×4 matrix, with first pixels 43 staggered in adjacent rows and first pixels 43 staggered in adjacent columns. The first pixel repeating unit 401 includes two first red sub-pixels 43a, four first green sub-pixels 43b, and two first blue sub-pixels 43c. The first red sub-pixels 43a and the first blue sub-pixels 43c are located in the same row and alternately distributed in sequence, the first red sub-pixels 43a and the first blue sub-pixels 43c are located in the same column and alternately distributed in sequence, the first green sub-pixels 43b and the first red sub-pixels 43a in the same row are arranged in alternating rows together with the first blue sub-pixels 43c.

Furthermore, one of the first pixel driving circuits can drive a plurality of sub-pixels with the same color of the display light-transmitting region 101 to emit light to reduce the space of other regions squeezed by the first pixel driving circuit. For example, one first pixel driving circuit can simultaneously drive two first red sub-pixels 43a, or four first green sub-pixels 43b, or two first blue sub-pixels 43c of the display light-transmitting region 101.

Figure 4:
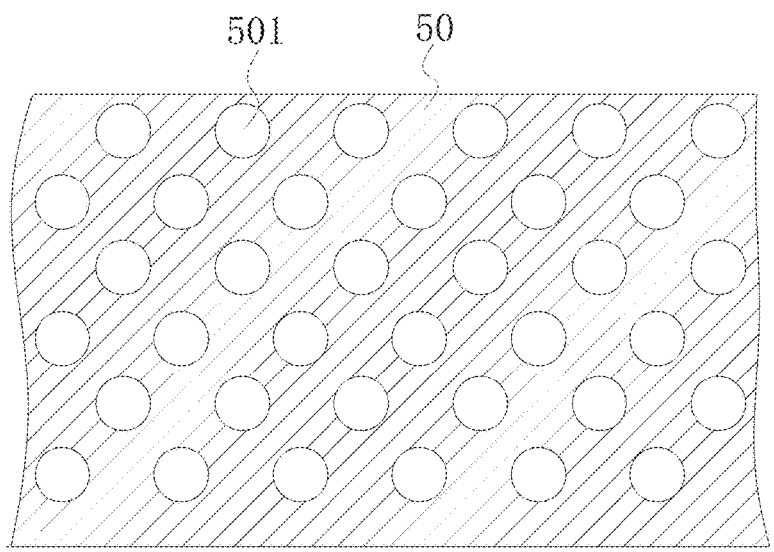
FIG. 4 is a schematic plan view of a second electrode layer in a display light-transmitting region provided in an embodiment of the present application.

As shown in FIG. 2 and FIG. 4, a first opening 501 between the first pixels 43 adjacent to each other in the display light-transmitting region 101 is defined by the second electrode layer 50, thereby increasing the light transmittance of the display light-transmitting region 101.

In designing the second electrode layer 50 of the display light-transmitting region 101 to be dug to form the first opening 501, laser radium can be utilized. Specifically, the second electrode layer 50 can be laser-emitted by an ultraviolet (UV), visible or IR dot laser. Laser includes two ways of front laser (the direction of the second electrode layer 50 towards light-emitting layer 40) and back laser (the direction of the light-emitting layer 40 towards the second electrode layer 50). The general back laser needs to set up a metal layer (such as Mo metal) on the substrate 10 of the display panel 100. The metal layer of the main display region 102 is used for the prevention of electrostatic buildup. The metal layer within the display light-transmitting region 101 is used for shielding the light-emitting material layer 42 above to avoid damage to the light-emitting material layer 42 when the laser is processed from the back side. In the embodiment of the present application, it is preferred to utilize the way of front laser, so that the display light-transmitting region 101 does not have to dispose a metal layer for shading. Not only can the light transmittance of the display light-transmitting region be further increased, but the process can be relatively simpler.

Figure 5:
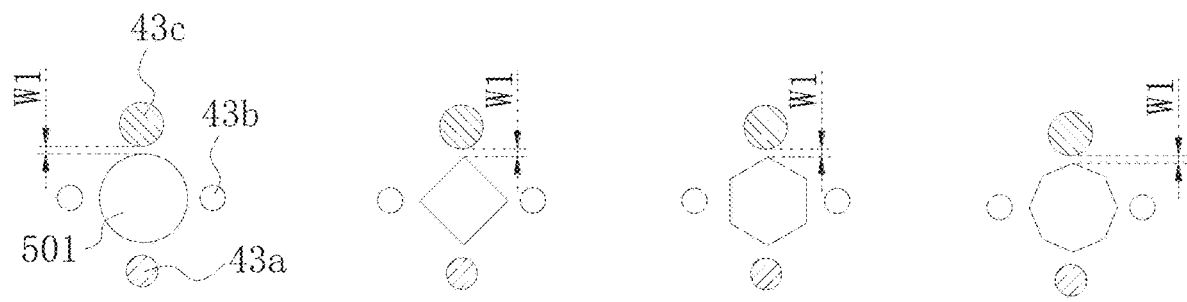
FIG. 5 is a schematic plan view of a first opening provided in an embodiment of the present application.

After forming the second electrode layer 50 by whole-surface evaporation, the laser irradiates from above the second electrode layer 50 to a region between the adjacent first pixels 43, causing the temperature of the irradiated region to rise by thermal relaxation and heat transfer, causing the changes such as melting and vaporization of the irradiated film layers, causing the metal material of the second electrode layer 50 which is irradiated to be peeled off, thereby implementing the patterning of the second electrode layer 50 of the display light-transmitting region 101. Compared with the back side laser, the front side laser does not need to add a shading metal layer for protection, and the area of the region to be patterned (the region corresponding to the first opening 501) and the depth of the film layers to be removed are adjusted by controlling the spot size and energy of the laser. The spot length of the laser needs to be smaller than the distance between the adjacent first pixels 43 to avoid laser from irradiating the region where the first pixels 43 are located. As shown in FIG. 5, the spot needs to be 2 micrometers and more from the edge of the nearest first pixel 43, i.e., the first opening 501 has a minimum distance W1 greater than or equal to 2 µm from the first pixel 43 adjacent thereto to avoid laser damage to the light-emitting material layer 42 due to the heat transfer effect of the laser. The minimum distance mentioned above refers to the minimum distance between the orthographic projection of the first pixels 43 on the second electrode layer 50 and the first opening 501, namely referring to the minimum distance between the horizontal planes. The minimum distances mentioned below all refer to the minimum distance between the horizontal planes.

As shown in FIG. 2, the first electrode layer 30 includes a first electrode block 31 located in the display light-transmitting region 101. Each of the first electrode block is corresponding to one of the first pixels 43. The first opening 501 has a minimum distance W2 greater than or equal to 2 µm from the first electrode block 31 adjacent thereto.

The first electrode layer 30 further includes a second electrode block 32 located in the main display region 102. The second electrode block 32 is corresponding to the second pixels 44. The first opening 501 at the junction is adjacent to the second electrode block 32 at the junction besides adjacent to the first electrode block 31, so a minimum distance W3 between the first opening 501 at the junction of the display light-transmitting region 101 and the main display region 102 and the second electrode block 32 adjacent thereto is greater than or equal to 2 µm in the embodiment of the present application, thereby avoiding damage to the adjacent second pixels 44 during the laser irradiation.

Please refer to FIG. 5. A shape of the first opening 501 includes but not limited to any one of circles, ellipses, regular polygons, and irregular polygons.

Figure 6:
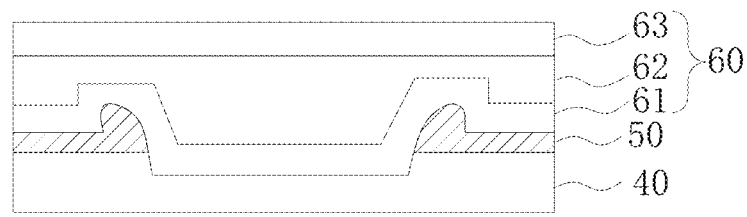
FIG. 6 is a schematic diagram of a stacked structure of film layers at a first opening of a display light-transmitting region provided in an embodiment of the present application.

As shown in FIG. 6, the display panel 100 further includes an encapsulation layer 60 located on the second electrode layer 50. The encapsulation layer 60 can include a first inorganic layer 61, an organic layer 62, and a second inorganic layer 63 sequentially deposited on the second electrode layer 50. The first inorganic layer 61 can be whole-surface deposited on the second electrode layer 50 by a manner of chemical vapor deposition (CVD). The step coverage of the film layers prepared by a chemical vapor deposition process is relatively good. The first inorganic layer 61 covers the second electrode layer 50.

Figure 7:
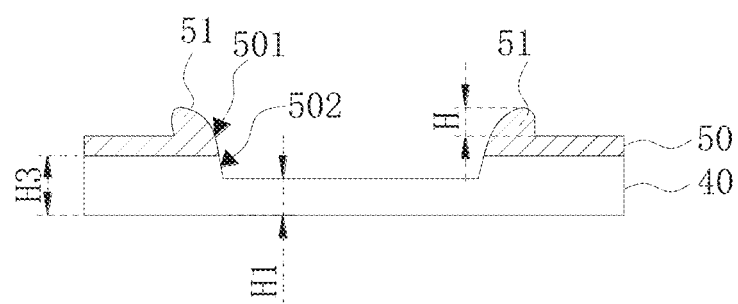
FIG. 7 is another schematic diagram of a stacked structure of film layers at a first opening of a display light-transmitting region provided in an embodiment of the present application.
Figure 8:
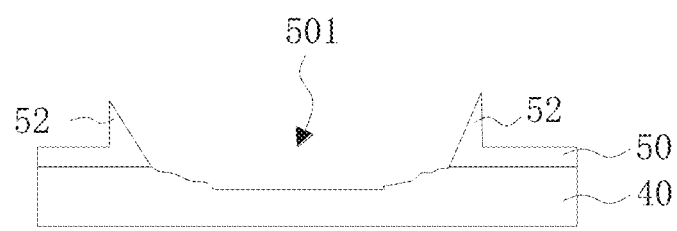
FIG. 8 is a schematic diagram of a structure of a burr at an edge of a first opening of a display light-transmitting region provided in an embodiment of the present application.

In an embodiment of the present application, as shown in FIG. 7, the second electrode layer 50 has a protruded structure 51 disposed at an edge of the first opening 501. During the process of peeling, the second electrode layer 50 will produce a burr 52 at the edge of the first opening 501, as shown in FIG. 8, the burr 52 is generally in the shape of a sharp cone, so the presence of the burr 52 may risk piercing or penetrating through the first inorganic layer 61 of the encapsulation layer 60, thereby causing the failure of the encapsulation layer 60. The embodiment of the present application can make the burr 52 smooth by secondary laser, the center position of the spot of the secondary laser overlaps with the center position of the spot of the first laser, the spot size needs to be greater than the spot size of the first laser, and the energy density of laser needs to be reduced. After the secondary laser, the surface of the burr 52 will become smooth and the height of the burr 52 will be reduced, thereby reducing the risk of failure of the encapsulation layer 60.

It can be understood that the energy and depth of the laser will affect the depth and edge thickness of the cathode metal peeling. If the laser energy is too low, the peeling will not be complete and there will be residual cathode metal in the laser irradiated region, which will affect the transmission of external light signals to the under-display image sensor; if the laser energy is too high, the cathode will be effectively peeled off in the irradiated region, but the excessive energy will damage the organic film layer below the cathode. At the same time, the thermal effect of too high energy will make the edges of the peeled region curl or even tear up most of the film layer, thus affecting the region where the second electrode layer 50 is not irradiated, and further causing subsequent failure of encapsulation and abnormalities of display. The embodiment of the present application is divided into two laser irradiations to form the above-mentioned protruded structure 51, which can reduce the generation of the above-mentioned defects.

As shown in FIG. 7, the protruded structure 51 of the second electrode layer 50 irradiated by two times of laser irradiations will be formed at the edge of the first opening 501. The protruded structure 51 includes a smoothly curved surface at one side away from the light-emitting layer 40. A thickness of the protruded structure 51 will be further reduced relative to a height of the burr 52, so that a surface contacted with the first inorganic layer 61 will become a smoothly curved surface. The reduction of thickness and the formation of the smoothly curved surface can both ameliorate the risk of the failure of subsequent encapsulation caused by the burr 52. A smoothly curved surface is a surface having a certain curvature where each of straight lines on the surface is a curve with a certain curvature rather than a fold line.

In addition, a maximum thickness H of the protruded structure 51 is less than a thickness of the first inorganic layer 61 to avoid the protruded structure 51 from piercing the first inorganic layer 61. Since the smoothly curved surface of the protruded structure 51 is not a flat surface, there will be a maximum thickness H of the protruded structure 51 along a thickness direction of the second electrode layer 50.

Considering the overall film thickness of the display panel 100 and the encapsulation effect of the encapsulation layer 60, the thickness of the first inorganic layer 61 is generally greater than or equal to 1 μm. Therefore, in the embodiment of the present application, the maximum thickness H of the protruded structure 51 is less than 1 μm to avoid the adverse effect of the larger thickness of the protruded structure 51 on the first inorganic layer 61. Optionally, a width of the protruded structure 51 is less than 1 μm, a direction of the width referring to a direction along the first opening 501 pointing towards the protruded structure 51.

A thickness of the second electrode layer 50 corresponding to the first pixels 43 is the same as a thickness corresponding to the main display region 102. The thickness is in range of 120-140 Å. In specific, the thickness can be 132 Å.

Please refer to FIG. 7, to ensure the first opening 501 of the embodiment of the present application being able to pass through the second electrode layer 50, and ensure the second electrode layer 50 corresponding to the laser irradiation region being completely removed, the depth of the first opening 501 can extend to the below film layers to remove part of film layers of the light-emitting layer 40 corresponding to the first opening 501. Specifically, as shown in FIG. 1, the thickness H1 of the light-emitting layer 40 corresponding to the first opening 501 in the display light-transmitting region 101 is less than the thickness H2 of the light-emitting layer 40 between the second pixels 44 adjacent to each other in the main display region 102. By removing part of the thickness of the film layers of the light-emitting layer 40 at the first opening 501, it can ensure the front laser process completely removing the film layers of the second electrode layer 50 at the first opening 501, thereby improving the light transmittance of the display light-transmitting region 101.

As shown in FIG. 7, the thickness of the light-emitting layer 40 corresponding to the first opening 501 in the display light-transmitting region 101 is less than a thickness H3 of the light-emitting layer 40 between the first pixels 43 adjacent to each other and overlapping with the second electrode layer 50 in the display light-transmitting region 101. Since the region adjacent to the first pixels 43 other than the first opening 501 will not be irradiated by the laser and this region is covered by the second electrode layer 50, the thickness of the light-emitting layer 40 in this region will be greater than the thickness of the light-emitting layer 40 at the first opening 501.

A second opening 502 corresponding to the first opening 501 in the display light-transmitting region 101 is defined by the light-emitting layer 40. The first opening 501 communicates with the second opening 502. The second opening 502 at least passes through the electron injection layer. Specifically, the second opening 502 can pass through the electron injection layer, can also continuously extend to pass through the electron transport layer, or can further pass through all film layers of the light-emitting layer 40.

Embodiments of the present application also provide a display device including a display panel 100 of any one of the embodiments mentioned above and an image sensor. The image sensor is disposed corresponding to the display light-transmitting region 101.

From the above discussion, the display panel 100 and the display device disclosed by the embodiments of the present application include a display light-transmitting region 101 and a main display region 102 disposed outside the display light-transmitting region 101. The display panel 100 includes a substrate 10, a first electrode layer 30 disposed on one side of the substrate 10, a light-emitting layer 40 disposed on one side of the first electrode layer 30 away from the substrate 10, and a second electrode layer 50 disposed on one side of the light-emitting layer 40 away from the substrate 10. The light-emitting layer 40 includes a plurality of first pixels 43 disposed in the display light-transmitting region 101 and a plurality of second pixels 44 disposed in the main display region 102. A first opening 501 between the first pixels 43 adjacent to each other in the display light-transmitting region 101 is defined by the second electrode layer 50. A thickness of the light-emitting layer 40 corresponding to the first opening 501 in the display light-transmitting region 101 is less than a thickness of the light-emitting layer 40 between the second pixels 44 adjacent to each other in the main display region 102. By reducing the thickness of the light-emitting layer at the first opening of the second electrode layer in the display light-transmitting region, the embodiments of the present application not only improve the light transmittance of the display light-transmitting region while ensuring the normal display of the first pixels of the display light-transmitting region, but also make the process simpler.

In the embodiments described above, the description of each embodiment has its own focus, and the parts that are not described in detail in a certain embodiment can be found in the relevant descriptions of other embodiments.

The display panel and the display device provided by the embodiments of the present application have been described in detail above, and the principles and implementations of the present application are described with specific examples. The descriptions of the above embodiments are only used to help understand the technology solutions and core ideas of the present application; a person of ordinary skill in the art should understand that: it is still possible to modify the technical solutions described in each of the above-mentioned embodiments, or to perform equivalent replacements for some of the technical features; and these modifications or replacements do not make the essence of the corresponding technical solutions deviates from the scope of the technical solutions of each embodiment of the present application.

What is claimed is:

1. A display panel comprising a display light-transmitting region and a main display region disposed outside the display light-transmitting region, the display panel comprising:
a substrate;
a first electrode layer disposed on one side of the substrate;
a light-emitting layer disposed on one side of the first electrode layer away from the substrate, the light-emitting layer comprising: a plurality of first pixels disposed in the display light-transmitting region and a plurality of second pixels disposed in the main display region; a number of the first pixels per unit area being equal to a number of the second pixels per unit area;
a second electrode layer disposed on one side of the light-emitting layer away from the substrate, a first opening between the first pixels adjacent to each other in the display light-transmitting region being defined by the second electrode layer;
wherein a thickness of a portion of the light-emitting layer corresponding to the first opening in the display light-transmitting region is less than a thickness of a portion of the light-emitting layer between the second pixels adjacent to each other in the main display region;
the second electrode layer has a protruded structure disposed at an edge of the first opening.

2. The display panel as claimed in claim 1, wherein the thickness of the portion of the light-emitting layer corresponding to the first opening in the display light-transmitting region is less than a thickness of a portion of the light-emitting layer between the first pixels adjacent to each other and overlapping with the second electrode layer in the display light-transmitting region.

3. The display panel as claimed in claim 1, wherein the light-emitting layer comprises: a hole injection layer, a hole transport layer, an electron transport layer, and an electron injection layer sequentially stacked,
a second opening corresponding to the first opening in the display light-transmitting region is defined by the light-emitting layer, the second opening at least passes through the electron injection layer.

4. The display panel as claimed in claim 1, wherein the first opening has a minimum distance greater than or equal to 2 μm from the first pixel adjacent thereto.

5. The display panel as claimed in claim 4, wherein the first electrode layer comprises: a first electrode block disposed corresponding to the first pixel;
the first opening has a minimum distance greater than or equal to 2 μm from the first electrode block adjacent thereto.

6. The display panel as claimed in claim 1, wherein the display panel further comprises a first inorganic layer covering the second electrode layer, a maximum thickness of the protruded structure is less than a thickness of the first inorganic layer.

7. A display panel comprising a display light-transmitting region and a main display region disposed outside the display light-transmitting region, the display panel comprising:
a substrate;
a first electrode layer disposed on one side of the substrate;
a light-emitting layer disposed on one side of the first electrode layer away from the substrate, the light-emitting layer comprising: a plurality of first pixels disposed in the display light-transmitting region and a plurality of second pixels disposed in the main display region;
a second electrode layer disposed on one side of the light-emitting layer away from the substrate, a first opening between the first pixels adjacent to each other in the display light-transmitting region being defined by the second electrode layer;
wherein a thickness of a portion of the light-emitting layer corresponding to the first opening in the display light-transmitting region is less than a thickness of a portion of the light-emitting layer between the second pixels adjacent to each other in the main display region.

8. The display panel as claimed in claim 7, wherein the thickness of the portion of the light-emitting layer corresponding to the first opening in the display light-transmitting region is less than a thickness of a portion of the light-emitting layer between the first pixels adjacent to each other and overlapping with the second electrode layer in the display light-transmitting region.

9. The display panel as claimed in claim 7, wherein the light-emitting layer comprises: a hole injection layer, a hole transport layer, an electron transport layer, and an electron injection layer sequentially stacked, a second opening corresponding to the first opening in the display light-transmitting region is defined by the light-emitting layer, the second opening at least passes through the electron injection layer.

10. The display panel as claimed in claim 7, wherein the second electrode layer has a protruded structure disposed at an edge of the first opening.

11. The display panel as claimed in claim 10, wherein the first opening has a minimum distance greater than or equal to 2 μm from the first pixel adjacent thereto.

12. The display panel as claimed in claim 11, wherein the first electrode layer comprises: a first electrode block disposed corresponding to the first pixel;

the first opening has a minimum distance greater than or equal to 2 μm from the first electrode block adjacent thereto.

13. The display panel as claimed in claim 10, wherein the display panel further comprises a first inorganic layer covering the second electrode layer, a maximum thickness of the protruded structure is less than a thickness of the first inorganic layer.

14. The display panel as claimed in claim 13, wherein the maximum thickness of the protruded structure is less than 1 μm.

15. The display panel as claimed in claim 7, wherein a number of the first pixels per unit area is equal to a number of the second pixels per unit area.

16. The display panel as claimed in claim 15, wherein the display panel further comprises:

a driving circuit layer disposed between the substrate and the light-emitting layer, the driving circuit layer comprises a first pixel driving circuit driving the first pixels to emit light and a second pixel driving circuit driving the second pixels to emit light;

the display light-transmitting region comprises a light-transmitting subregion and a transition subregion, the transition subregion is disposed between the light-transmitting subregion and the main display region;

the first pixel driving circuit driving the first pixels in the light-transmitting subregion to emit light is disposed in the transition subregion, or, the first pixel driving circuit driving the first pixels in the light-transmitting subregion to emit light is disposed in the light-transmitting subregion and overlapping with the first pixels corresponding thereto.

17. A display device comprising a display panel and an image sensor, the display panel comprising a display light-transmitting region and a main display region disposed outside the display light-transmitting region, the image sensor disposed corresponding to the display light-transmitting region, wherein the display panel comprises:

a substrate;

a first electrode layer disposed on one side of the substrate;

a light-emitting layer disposed on one side of the first electrode layer away from the substrate, the light-emitting layer comprising: a plurality of first pixels disposed in the display light-transmitting region and a plurality of second pixels disposed in the main display region;

a second electrode layer disposed on one side of the light-emitting layer away from the substrate, a first opening between the first pixels adjacent to each other in the display light-transmitting region being defined by the second electrode layer;

wherein a thickness of a portion of the light-emitting layer corresponding to the first opening in the display light-transmitting region is less than a thickness of a portion of the light-emitting layer between the second pixels adjacent to each other in the main display region.

18. The display device as claimed in claim 17, wherein the thickness of the portion of the light-emitting layer corresponding to the first opening in the display light-transmitting region is less than a thickness of a portion of the light-emitting layer between the first pixels adjacent to each other and overlapping with the second electrode layer in the display light-transmitting region.

19. The display device as claimed in claim 17, wherein the light-emitting layer comprises: a hole injection layer, a hole transport layer, an electron transport layer, and an electron injection layer sequentially stacked, a second opening corresponding to the first opening in the display light-transmitting region is defined by the light-emitting layer, the second opening at least passes through the electron injection layer.

20. The display device as claimed in claim 17, wherein the second electrode layer has a protruded structure disposed at an edge of the first opening.

* * * * *